United States Patent [19]

Tokuda et al.

[11] Patent Number: 5,614,899
[45] Date of Patent: Mar. 25, 1997

[54] APPARATUS AND METHOD FOR COMPRESSING TEXTS

[75] Inventors: Katsumi Tokuda, Osaka; Ryoichi Sugimura, Hyogo, both of Japan

[73] Assignee: Matsushita Electric Co., Ltd., Osaka, Japan

[21] Appl. No.: 348,721

[22] Filed: Dec. 2, 1994

[30] Foreign Application Priority Data

Dec. 3, 1993 [JP] Japan .................................. 5-304137

[51] Int. Cl.$^6$ ................................................ H03M 7/30
[52] U.S. Cl. .............................. 341/51; 341/65; 395/803
[58] Field of Search .................................. 341/51, 55, 65, 341/79

[56] References Cited

U.S. PATENT DOCUMENTS

| | | | |
|---|---|---|---|
| 4,906,991 | 4/1988 | Fiala et al. | 341/51 |
| 4,988,998 | 1/1991 | O'Brien | 341/55 |
| 5,023,610 | 6/1991 | Rubow et al. | 341/51 |
| 5,058,144 | 10/1991 | Fiala et al. | 375/122 |
| 5,099,426 | 3/1992 | Carlgren et al. | 364/419 |
| 5,109,433 | 4/1992 | Notenboom | 382/40 |
| 5,384,568 | 1/1995 | Grinberg et al. | 341/51 |

FOREIGN PATENT DOCUMENTS

| | | |
|---|---|---|
| 62-68325 | 3/1987 | Japan . |
| 63-209228 | 8/1988 | Japan . |
| 278323 | 3/1990 | Japan . |
| 4123619 | 4/1992 | Japan . |
| 4167821 | 6/1992 | Japan . |

OTHER PUBLICATIONS

"Data Compression", by Debra A. Lelewer and Daniel S. Hirschberg, pp. 260–295.

"The Toshiba Machine Translation System", by Shin–ya Amano et al., MT Summit, Jul. 17–19, 1987.

Primary Examiner—Marc S. Hoff
Attorney, Agent, or Firm—Price, Gess & Ubell

[57] ABSTRACT

A text compressing apparatus comprising morpheme-parsing unit for taking out words from sentences retrieved from an external storage unit, dictionary retrieving unit for converting the post-morpheme-parse words into form marks indicating the form of the detected words while referring to a parse dictionary, a structure-parsing unit for generating equation trees for each sentence, an expression rewriting unit for rewriting the words which are referred to as nodes into their representative words, an equation converting unit for converting the equation trees written into the representative expressions into words, and Huffman coding unit for converting the words from the equation tree converting unit into strings of bits.

40 Claims, 12 Drawing Sheets

FIG. 1

| WORD | STRING OF BITS |
|---|---|
| be | 001 |
| is | 010 |
| was | 011 |
| been | 100 |
| can | 110 |
| could | 111 |
| will | 1000 |
| would | 1001 |
| paid | 10000 |
| took | 10001 |
| spoke | 10010 |
| built | 10011 |
| today | 10100 |
| announce | 110000 |
| release | 110010 |
| publish | 110100 |
| announced | 110111 |
| released | 111001 |
| published | 111011 |
| brought | 111101 |
| bought | 111110 |
| ⋮ | ⋮ |

FIG. 3

| VOCABULARY INDEX | PART OF SPEECH | FORM MARK | PARSE PATTERN |
|---|---|---|---|
| ×××Electric | noun | | |
| Product | noun | | |
| appellation | noun | | |
| yesterday | noun | | |
| today | noun | | |
| announce | verb | announce.PRES | SVO |
| release | verb | release.PRES | SVO |
| publish | verb | publish.PRES | SVO |
| announced | verb | announce.PAST | SVO |
| released | verb | release.PAST | SVO |
| published | verb | publish.PAST | SVO |
| brought | verb | bring.PAST | SVO |
| bought | verb | buy.PAST | SVO |
| paid | verb | pay.PAST | SVO |
| took | verb | take.PAST | SVO |
| spoke | verb | speak.PAST | SVO |
| built | verb | build.PAST | SVO |
| be | verb | be.ORIG | SVO |
| is | verb | be.PRES | SVO |
| was | verb | be.PAST | SVO |
| been | verb | be.PP | |
| will | auxiliary verb | will.PRES | |
| would | auxiliary verb | will.PAST | |
| can | auxiliary verb | can.PRES | |
| could | auxiliary verb | can.PAST | |

FIG. 4A

×××Electric_will release_a_new_product.

The_appelation_will_be_published_today.

The_name_of_the_product_was_announced_yesterday.

FIG. 4B

×××Electric_will.PRES_release.PRES_a_new_product.

The_appelation_will.PRES_be.ORIG_publish.PP_today.

The_name_of_the_product_be.PAST_announce.PAST_yesterday.

FIG. 5

| WORD | REPRESENTATIVE EXPRESSION |
|---|---|
| appellation | name |
| name | name |
| release | announce |
| publish | announce |
| yet | still |
| name | call |

FIG. 7

| REPRESENTATIVE EXPRESSION | STRINGS OF BITS |
|---|---|
| ORIG(INFINITIVE) | 001 |
| PRES(PRESENT) | 010 |
| PAST(PAST TENSE) | 011 |
| PP(PAST PARTICLE) | 100 |
| be | 1000 |
| will | 1010 |
| announce | 10011 |
| see | 10100 |
| still | 100010 |
| but | 100111 |
| the | 110001 |
| that | 110110 |
| noun | 1010000 |
| ×××Electric | 1001010 |
| new product | 1001110 |
| name | 1010111 |
| yesterday | 1100110 |
| today | 1100101 | ddd ddd_eee ddd_eee fff_ggg hhh_iii ddd_eee fff_ggg (hhh_iii)

ddd_eee (fff_ggg (hhh_iii))

bbb (ddd_eee (fff_ggg (hhh_iii)))

APPARATUS AND METHOD FOR COMPRESSING TEXTS

BACKGROUND OF THE INVENTION (1) Field of the Invention

The present invention relates to an apparatus and method for compressing electronic texts to reduce the data size thereof.

(2) Description of the Related Art

The introduction of electronic texts has advanced a so-called "paperless system" in both the civil and public sectors. The electronic texts, or otherwise known as text files, are the texts represented by an array of character codes. The electronic texts are advantageous in that they are easily copied or delivered, and occupy only a small storage area.

When an electronic text is transmitted to a distant correspondent via a communication network, or delivered by means of a recording medium, such as a floppy disk or CD-ROM, the data size of the electronic text is reduced by compressing the character codes to save the communication cost and increase the number of the texts to be stored on one disk.

The electronic texts are generally compressed by lossless coding methods, such as LZW coding and Huffman coding. In the following, Huffman coding will be explained as an example.

In Huffman coding, the probabilities with which words appear in the texts are first determined. Next, bit strings are assigned to the words and an example of the bit strings is shown in FIG. 1: the words assigned short strings of bits have larger probabilities, whereas the words with smaller probabilities map to longer strings of bits. The words in the electronic text are converted into the strings of bits while referring to the compression table shown in FIG. 1. Assume that a sentence "XXX Electric will release a new product." consisting of six words, "XXX Electric", "will", "release", "a", "new", and "product", is converted into a string of bits. If a character code is 8 bits long, then, for example, a 32 bits long (8×4=32) word "will" is converted into a 4-bit string "1000" in Huffman coding, reducing the code size to one eighths ($4/32=1/8$).

Huffman coding is most effective when the probabilities are determined as accurately as possible and the short strings of bits are assigned to the words with large probabilities.

However, in practice, a writer avoids repeating words or phrases and instead uses synonyms to have a wide vocabulary; for example, the writer may use "an apology" for the first occurrence and "an excuse" for the second. This reduces the probabilities for each word, and the resulting Huffman coding is not satisfactorily efficient. In addition, the fact that verbs and auxiliary verbs have different forms makes it difficult to increase compression efficiency. For example, an irregular verb "be" has six forms: "be", "is", "are", "was", "were", and "been". If the verb "be" invariably appears as "is", then the word is compressed efficiently; however, having the different forms reduces the probabilities for the verb "be", and hence making Huffman coding less effective.

There are other coding methods known as "lossy coding". An example of the lossy coding is disclosed in Japanese Laid-open Patent Application No. 4-156663. In the lossy coding, each sentence in one electronic text is morpheme-parsed while referring to a certain dictionary to be partitioned into words. Then, semantic information of each word is retrieved from the dictionary, based on which the importance of each word is determined. If the determined importance is below a predetermined level, such words are deleted to reduce the amount of data. However, because the reduction is limited to the data amount of the deleted words, the compression efficiency is not satisfactory either. Besides, the restored data as a result of compression and subsequent expansion are not true to the original data because some words are omitted.

Huffman coding may be combined with the lossy coding to enhance the compression efficiency: a text is coded after less important words are deleted. However, the text is restored by omitting some words as is with the case in the lossy coding alone.

SUMMARY OF THE INVENTION

Accordingly, the present invention has a first object to provide an apparatus and method for compressing texts efficiently by rewriting synonymous words with a representative word first and then applying a lossless coding method.

The present invention has a second object to provide an apparatus and method for compressing texts efficiently by rewriting words in different forms with their respective infinitives first and then applying a lossless coding method.

The first object can be fulfilled by a text file compressing apparatus comprising: a word detecting unit for detecting words in sentences composing a text file; a representative word storage unit for classifying a plurality of words into a plurality of sets of synonymous words to store the sets with a representative word for each set; a representative word retrieval unit for retrieving the representative words for the detected words from their respective sets in the representative word storage unit; a representative word rewrite unit for rewriting the detected words into the retrieved representative words; and a coding unit for coding the text file after the detected words are rewritten by the representative word rewrite unit.

The coding unit may include: a correspondence table storage unit for storing a correspondence table showing a relation between a plurality of words and string of bits; and a string-of-bits conversion unit for converting each detected word in the text file into the string of bits after the detected words are rewritten into the representative words by the representative word rewrite unit.

The strings of bits in the correspondence table may be variable; and the representative word in each set may be assigned a shortest string of bits compared with other words in the set.

Words with high probabilities with which the words appear in the texts may be assigned short strings of bits, and words with small probabilities may be assigned long strings of bits.

The first object can be also fulfilled by a method for compressing a text file for a text file compressing apparatus including a text file storage unit for storing text files, a representative word storage unit for classifying a plurality of words into a plurality of sets of synonymous words to store the sets with a representative word for each set, and a code information storage unit for storing code information used to code words in the text file, the method comprising the steps of: detecting words in sentences comprising the text file; retrieving the representative words from the sets for the detected words; rewriting the detected words with the retrieved representative words; and coding the text file after the detected words are rewritten into the representative words while referring to the code information in the code information storage unit.

The coding step may include: converting the words in the text file into string of bits after the detected words are rewritten into the representative words, while referring to the code information in the code information storage unit, the code information being stored in the form of a correspondence table showing a relation between a plurality of words and strings of bits.

The coding step may include: converting the words in the text file into string of bits after the words are rewritten into the representative words while referring to the code information, the code information being stored in the code information storage unit in the form of a dictionary including words arranged in an order of probabilities with which the words appear in the file text, the strings of bits showing an order of each word in the code information.

According to the present invention, the synonymous words are rewritten into an adequate representative word first and subsequently compressed based on the probabilities with which the representative word appears in one text. Thus, if a text includes a wide vocabulary, not only is the text compressed efficiently, but also the resorted text is substantially true to the original.

The second object can be fulfilled by a text file compressing apparatus for compressing a text file, the text file compressing apparatus comprising: a detecting unit for detecting words in sentences composing a text file; a form storage unit for storing form information for a plurality of words, the form information composing infinitives and form marks indicating forms of the words; a form information retrieval unit for retrieving the form information that matches with the words detected by the detection unit from the form storage unit; a form information rewrite unit for rewriting the words detected by the detection unit into their respective form information; and a coding unit for coding the text file after the words detected by the detecting unit are rewritten into the representative words by the form information rewrite unit.

The coding unit may include: a correspondence table storage unit for storing a correspondence table showing a relation between a plurality of words and string of bits; and a string-of-bits conversion unit for converting each detected word in the text file into the string of bits after the detected words are rewritten into the representative words by the representative word rewrite unit.

The infinitives may be assigned shorter strings of bits compared with their different forms in the correspondence table.

Words with high probabilities with which the words appear in the texts may be assigned short strings of bits, and words with small probabilities may be assigned long strings of bits.

The correspondence storage unit may further store the form marks in relation with the strings of bits, whereby the string-of-bits conversion unit converts the form marks into the strings of bits.

The second object can be also fulfilled by a method for compressing a text file for a text file compressing apparatus including a text file storage unit for storing text files, a form storage unit for storing a plurality of words in the form of infinitives and form marks specifying a form of each word, and a code information storage unit for storing code information used to code words in the text file, the method comprising the steps of: detecting words in sentences composing the text file; retrieving form information that matches with the detected words from the form storage unit; rewriting the detected words with their respective form information; and coding the text file after the words are rewritten into the form information while referring to the code information in the code information storage unit.

The coding step may include: converting the words in the text file into string of bits after the detected words are rewritten into the representative words while referring to the code information in the code information storage unit, the code information being stored in the form of a correspondence table showing a relation between a plurality of words and strings of bits.

The rewriting step may include: rewriting the form marks in the text file into strings of bits while referring to the correspondence table, the correspondence table further showing a relation between the strings of bits and form marks.

According to the above structure, the words in different forms are rewritten into their respective infinitives before they are compressed to increase the probabilities. Thus, the compression efficiency can be enhanced.

BRIEF DESCRIPTION OF THE DRAWING

These and other objects, advantages and features of the invention will become apparent from the following description thereof taken in conjunction with the accompanying drawings which illustrate specific embodiments of the invention. In the drawings:

FIG. 1 is a view showing a compression table used in Huffman coding;

FIG. 3 is a view showing a content of a parse dictionary;

FIGS. 4A through 4C are views showing sentence-to-equation-tree transition;

FIG. 5 is a view showing a content of an expression conversion dictionary;

FIG. 7 is a view showing another compression table;

DESCRIPTION OF THE PREFERRED EMBODIMENTS

FIRST EMBODIMENT

Figure 2:
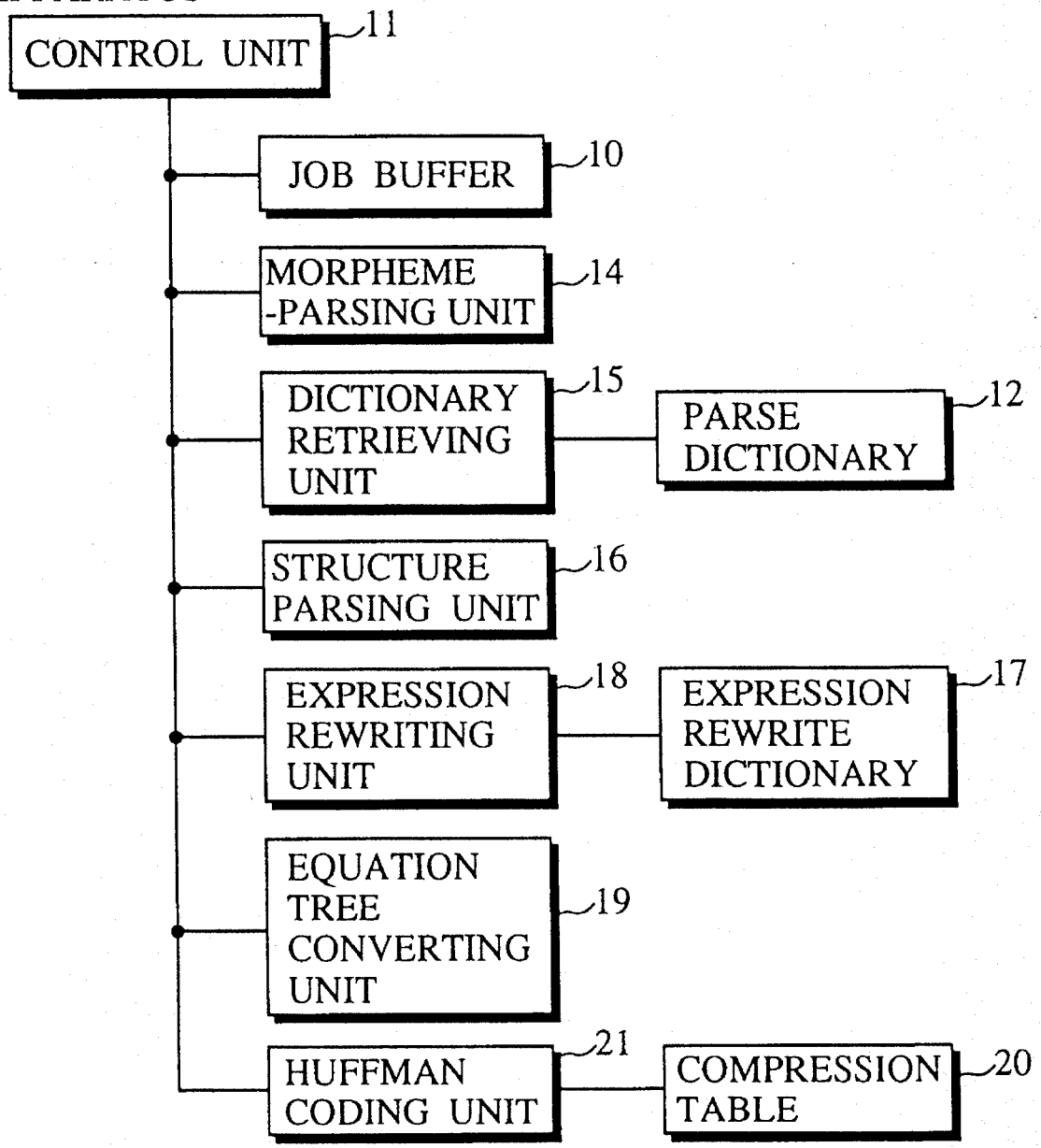
FIG. 2 is a view depicting a structure of a text compressing apparatus in accordance with a first embodiment of the present invention.

FIG. 2 is a view depicting the structure of a text compressing apparatus in accordance with the first embodiment of the present invention. The text compressing apparatus is installed in a text generating apparatus to reduce the memory size of electronic texts stored in an external storage unit. In this embodiment, assume that the electronic texts are written in English.

The text compressing apparatus comprises a job buffer 10, a control unit 11, a parse dictionary 12, a morpheme-parsing unit 14, a dictionary retrieving unit 15, a structure-parsing unit 16, an expression rewrite dictionary 17, an expression rewriting unit 18, an equation tree converting unit 19, a compression table 20, and a Huffman coding unit 21.

More precisely, the job buffer 10 is a text buffer with a capacity for storing character codes of one electronic text.

The control unit 11 opens a file for a desired electronic text stored in an external storage unit (not shown), and takes out all the sentences separately therefrom to deliver the same to the morpheme-parsing unit 14. Subsequently, the control unit 11 activates the morpheme-parsing unit 14, dictionary retrieving unit 15, structure-parsing unit 16, expression rewriting unit 18, equation tree converting unit 19, and Huffman coding unit 21 in turn.

The parse dictionary 12 stores words referred to as vocabulary indexes in relation with their parts of speech, form marks, and parse patterns as shown in FIG. 3. The form marks identify infinitives of the vocabulary indexes if they are in different forms. The form marks consist of infinitives appended with marks "ORIG", "PRES", "PAST", or "PP" specifying the infinitive, present tense, past tense, and past participle, respectively. The parse pattern is the information indicating which elements of sentence vocabulary indexes are; the elements of a sentence includes a subject, a predicate, an object, a complement, etc.

In the drawing, a form mark "publish. PRES" indicates a vocabulary index to its left is a present tense of a verb "publish", and a parsing pattern "SVO" in its right means that the vocabulary index is placed between a subject and a predicate. Similarly, a form mark "buy.PAST" indicates a vocabulary index to its left is the past tense of a verb "buy", i.e., "bought"; a form mark "be.ORIG" indicates a vocabulary index in to left is the infinitive of a verb "be"; a form mark "be.PP" indicates a vocabulary index to its left is the past participle of the verb "be", i.e., "been".

The morpheme-parsing unit 14 receives the sentences from the control unit 11, and morpheme-parses each. To be more specific, the morpheme-parsing unit 14 detects words in the sentences from the control unit 11 and partitions each sentence into words and deliver the same to the dictionary retrieving unit 15. Assume that the morpheme-parsing unit 14 morpheme-parses the three following sentences: "XXX Electric will release a new product.", "The appellation will be published today.", "The name of the product was announced yesterday.". Then the sentences are partitioned into the words by separators "_" as shown in FIG. 4A. For further explanation of the morpheme-parse, refer to "MT SUMMIT Manuscripts & Programs", Hakone Prince Hotel, Japan, Sep. 17–19, 1987, herein incorporated by reference.

The dictionary retrieving unit 15 receives post-morpheme-parse words from the morpheme-parsing unit 14 and searches the vocabulary indexes that match with the post-morpheme-parse words first and thence retrieves the form marks that match with the vocabulary indexes from the parse dictionary 12. In other words, the dictionary retrieving unit 15 converts the post-morpheme-parse words into the form marks. If there are no matching form marks, such post-morpheme-parse words remain intact. In this way, some of the post-morpheme-words in FIG. 4A are rewritten into the form marks as shown in FIG. 4B by the dictionary retrieving unit 15 while referring to the parse dictionary 12.

Figure 4C:
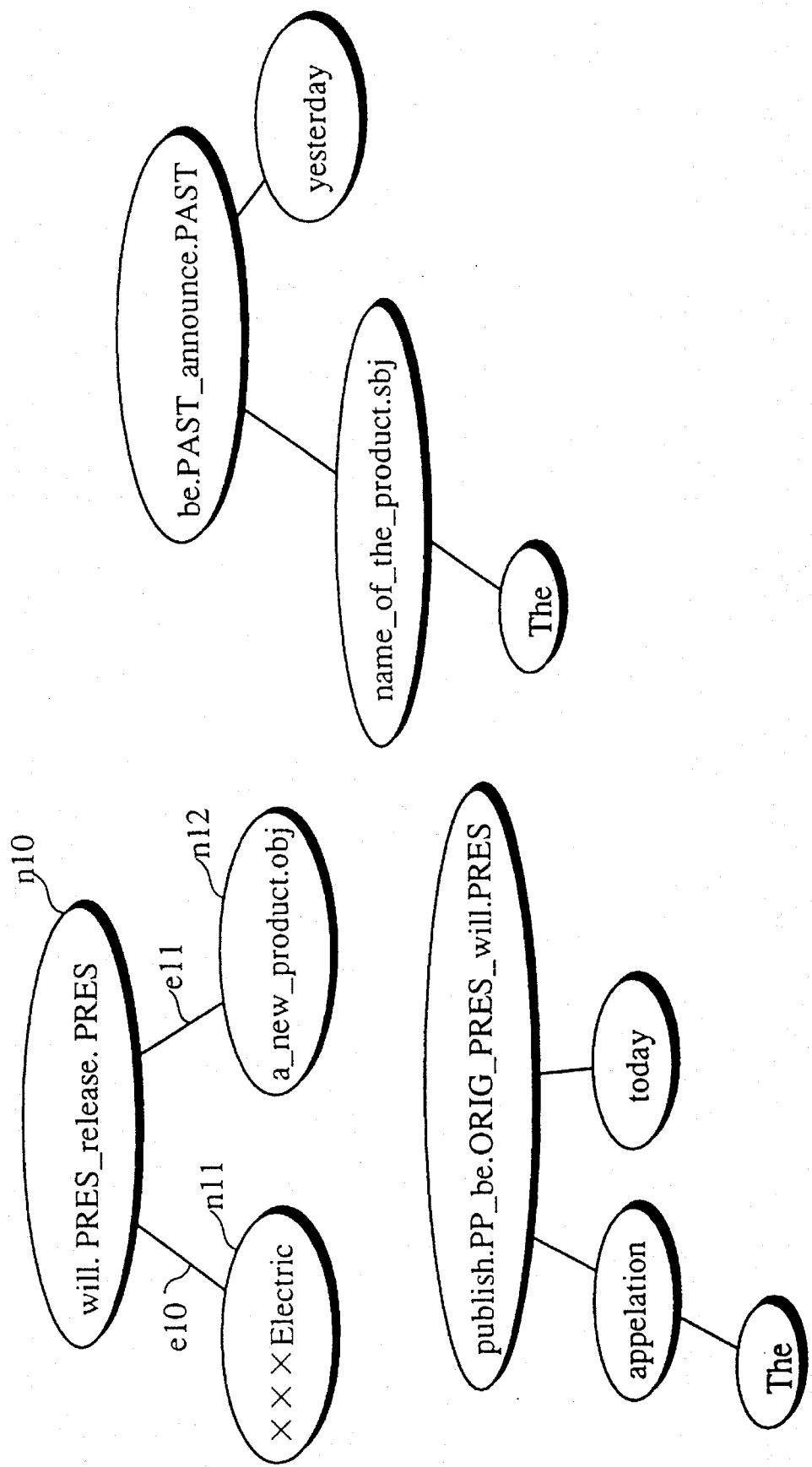

The structure-parsing unit 16 structure-parses the post-rewrite sentences and generates equation trees, that is to say, it searches a predicate in the post-rewrite sentence, and if there is a predicate, it converts the same into a predicate node. Further, the structure-parsing unit 16 searches the subject and object for the predicate, and converts the same into a subject node and an object node, respectively. For further information of the structure-parse, refer to "MT SUMMIT Manuscripts & Programs", Ibid. Subsequently, the subject node and predicate node, and predicate node and object node are linked, forming an equation tree. In the case of the first sentence in FIG. 4B, the structure-parsing unit 16 judges that the form mark "will.PRES_release.PRES" is a predicate while referring to the part of speech in the parse dictionary 12, and converts the same into the predicate node n10 as shown in FIG. 4C. Then, the structure parsing unit 16 judges that the subject and object are placed before and after "will.PRES_release.PRES", respectively while referring to the parse pattern "SVO". Thus, the structure-parsing unit 16 judges "XXX Electric" and "a_new_product" are the subject and object, respectively, and converts the same into the subject node n11 and object node n12, respectively. Then, the structure parsing unit 16 links the node n10 and node n11 with a link e10, and node n10 and node n12 with a link e11, generating the equation tree for one sentence. The other two sentences in FIG. 4B are converted into the equation trees as shown in FIG. 4C in the same manner.

The expression rewrite dictionary 17 stores the vocabulary indexes either in the form of the post-morpheme-parse words or infinitives in the form marks in the parse dictionary 12 in relation with their representative expressions, or namely, the most frequently used synonyms. FIG. 5 shows an example of the content in the expression rewrite dictionary 17: a word "announce" is more frequently used than a word "publish" and a word "release" in general, thus the word "announce" is stored as the representative expression for the last two words in the expression rewrite dictionary 17.

Figure 6:
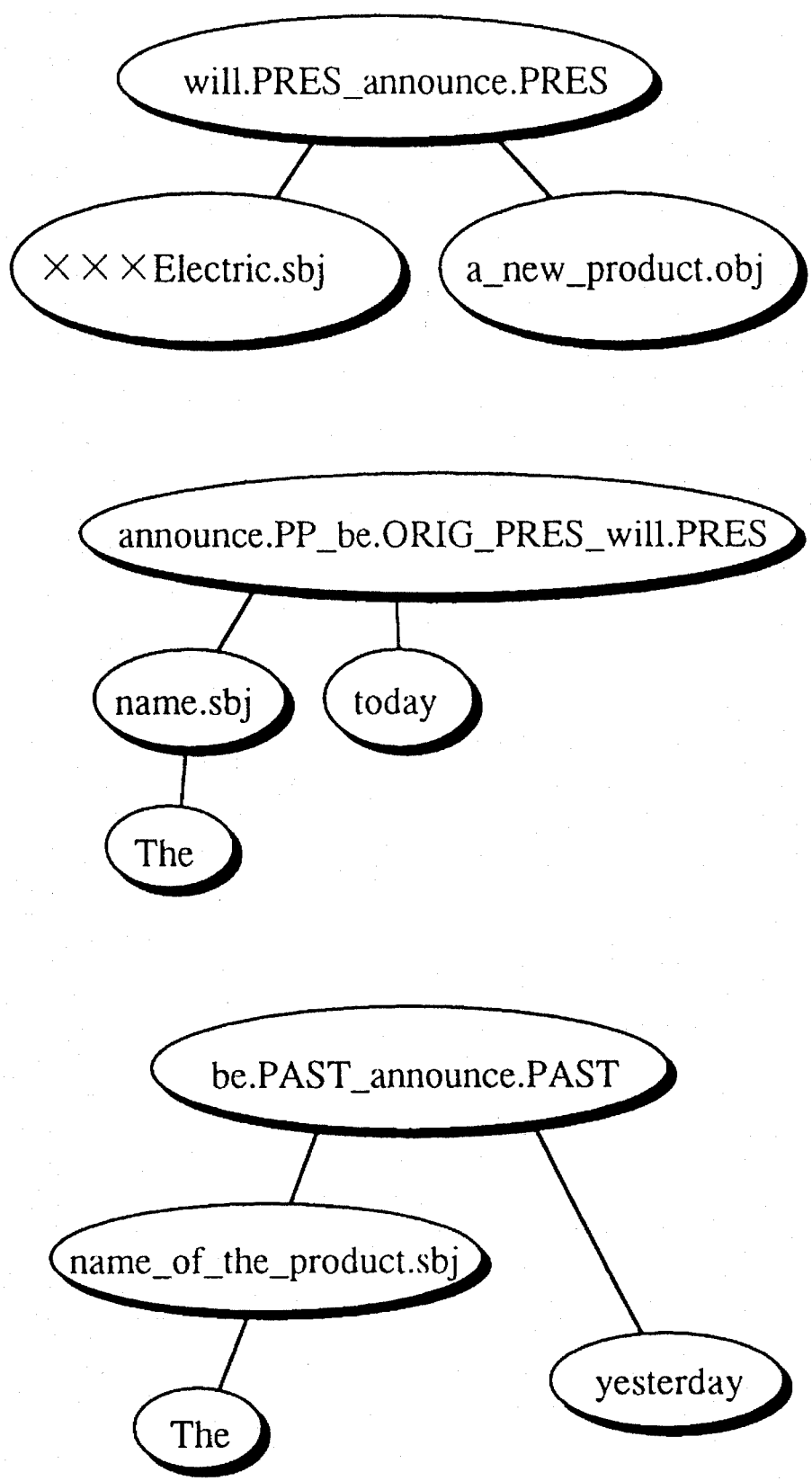
FIG. 6 is a view showing an equation tree after the rewriting of a word with a representative expression.

The expression rewriting unit 18 retrieves the representative expression from the expression rewrite dictionary 17 while referring to either the post-morpheme-parse words or infinitives in the form marks, and replaces some nodes of the equation tree with their respective representative expression nodes. As a result of the replacement with the representative expression, the equation trees shown in FIG. 4C are changed as shown in FIG. 6.

The equation tree converting unit 19 converts the sentences in the form of equation trees into strings of characters.

The compression table 20 holds words, form marks, and corresponding strings of bits as shown in FIG. 7. In the compression table 20, the words and form marks with large probabilities are assigned short strings of bits while the words and marks with small probabilities are assigned long strings of bits.

The Huffman coding unit 21 converts the sentences in the form of the strings of characters into the strings of bits while referring to the compression table 20.

Figure 8:
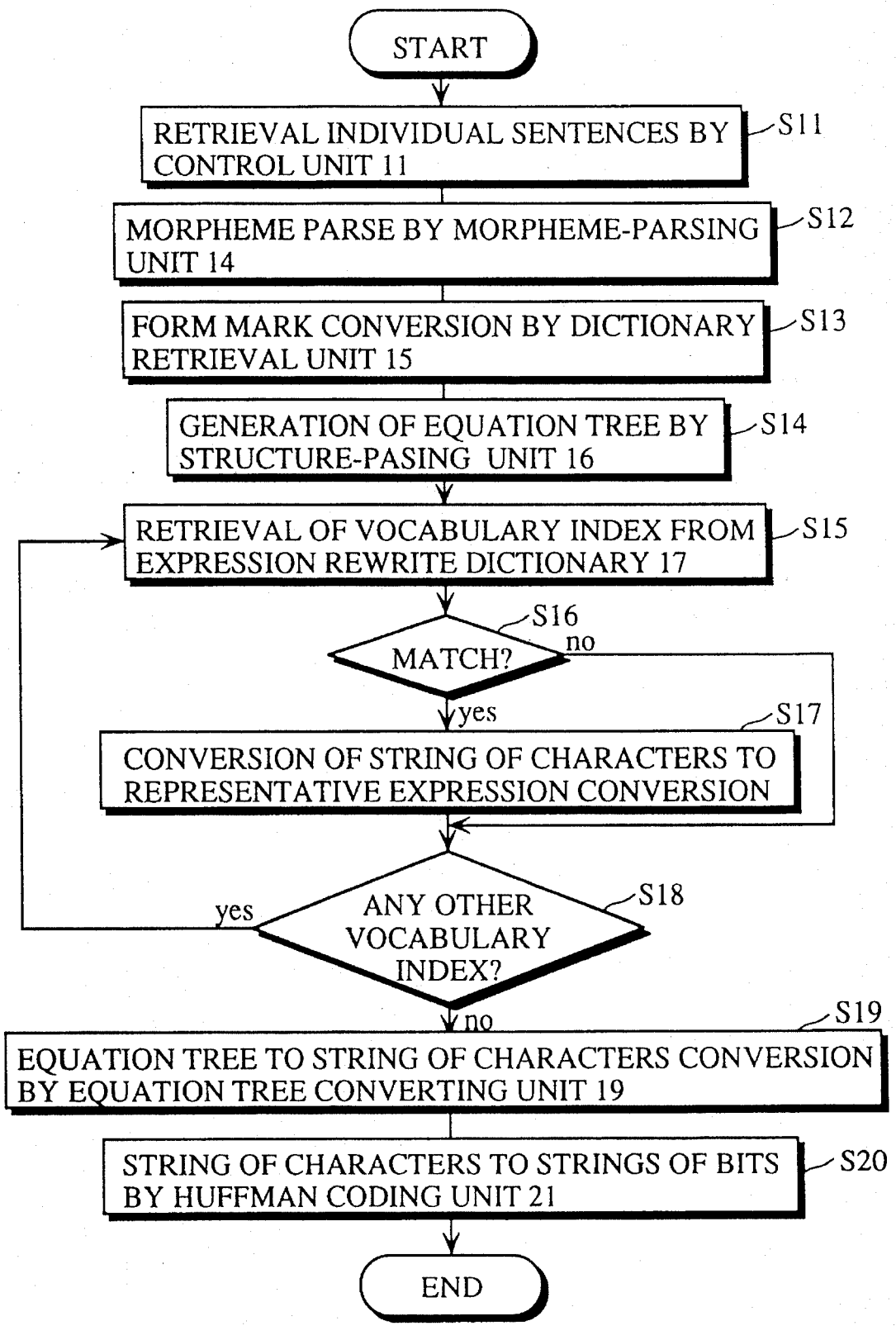
FIG. 8 is a flowchart detailing the operation of the text compressing apparatus in the first embodiment.
Figure 9:
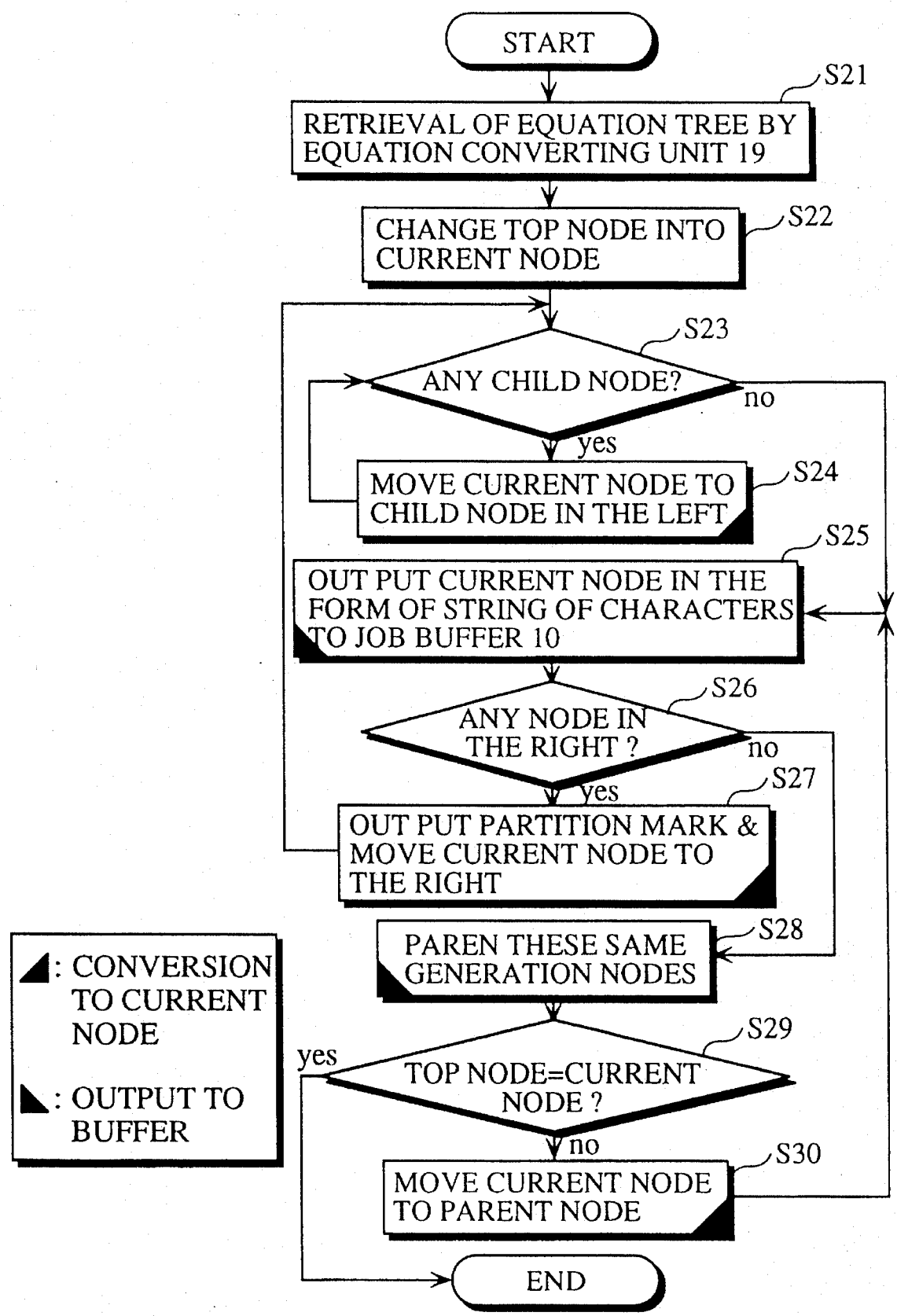
FIG. 9 is a flowchart detailing the operation of an equation tree converting unit in accordance with a second embodiment of the present invention.

FIG. 8 is a flowchart detailing the operation of the text compressing apparatus in FIG. 2, the explanation of which will be given in the following.

The control unit 11 takes out the following sentences: "XXX Electric will release a new product.", "The appellation will be published today.", "The name of the product was announced yesterday.", separately (S11).

The morpheme-parsing unit 14 morpheme-parses each of the taken out sentences and partitions the same into words (S12); the above three sentences are morpheme-parsed as shown in FIG. 4A.

The dictionary retrieving unit 15 searches the vocabulary indexes in the parse dictionary 12 that match with the post-morpheme-parse words and further takes out the form marks that match with the vocabulary indexes, rewriting some of the vocabulary indexes into the form marks (S13); the sentences in FIG. 4A are converted as shown in FIG. 4B as a result.

The structure-parsing unit 16 judges whether the post-rewrite words are the subject, predicate, object, complement, etc, in the sentence to generate the equation tree (S14); the sentences in FIG. 4B are converted into the equation trees as shown in FIG. 4C as a result.

The expression rewriting unit 18 retrieves either the post-morpheme-words or infinitives in the form marks from the expression rewrite dictionary 17 (S15).

The expression rewriting unit 18 judges whether the retrieved words match with the words in the equation tree (S16). If they match, the expression rewriting unit 18 rewrites the matching words into their respective representative expressions (S17); the equation trees in FIG. 4C are converted as shown in FIG. 6 as a result. If there are any other vocabulary index (S18), the flow returns to S15; otherwise it proceeds to S19.

The equation tree converting unit 19 converts the equation trees generated by the structure-parsing unit 16 into the strings of characters (S19).

Subsequently, the Huffman compressing unit 21 converts the strings of characters from the equation tree converting unit 19 into the strings of bits (S20).

According to the apparatus and method for compressing the texts in this embodiment, the texts can be efficiently compressed while restoring the text substantially true to the original texts.

Although an example of the third person singular for regular verbs is not shown in this embodiment, it is well assumed that a vocabulary index, for example "announces" is stored in the parse dictionary 12 with a part of speech "verb", a from mark "announce.PRES", and an adequate parse pattern.

The explanation was given using the text written in English; however, the present invention is applicable to electronic texts written in any natural language.

The structure of the text compressing apparatus is not limited to the above-described structure. For example, Huffman coding, which is realized by the compression table 20 and Huffman compressing unit 21 herein, may be replaced with any other known coding method based on probability information. For example, a coding unit comprising a dictionary generating unit and a converting•compressing unit may be used. The dictionary generating unit generates a dictionary arranging the words in order of small-to-large probabilities, and each word is assigned a string of bits indicating a location within the dictionary. The converting•compressing unit is activated after the dictionary is generated, and converts the words into the strings of bits indicating their respective locations, compressing the texts based on the probability information.

In the alternate case, the text compressing apparatus yields text files including the strings of bits and the dictionary arranging the words in order of small-to-large probabilities. This is because the dictionary is generated by detecting the words in the sentences within the electronic text, computing the probabilities for each word, and arranging a pair of a word and probabilities. Note that the dictionary thus generated may be shared by a plurality of electronic texts.

SECOND EMBODIMENT

In the second embodiment, the text compressing apparatus in the first embodiment is modified, so that it efficiently compresses the data of the texts in a language in which particles are placed between the phrases, such as Japanese.

For this reason, the sentences in the form of equation trees are further converted into the strings of characters in the same tree structure herein. In the resulting strings of characters, a parent-child relation between the nodes are represented by marks "("and")", and sibling relation by a mark "_". The above converting process will be explained while referring to the flowchart in FIG. 9 and FIGS. 10A through 10F. Note that like components are labeled with like reference numerals with respect to the first embodiment hereinafter, and the description of these components is not repeated.

Figure 10A:
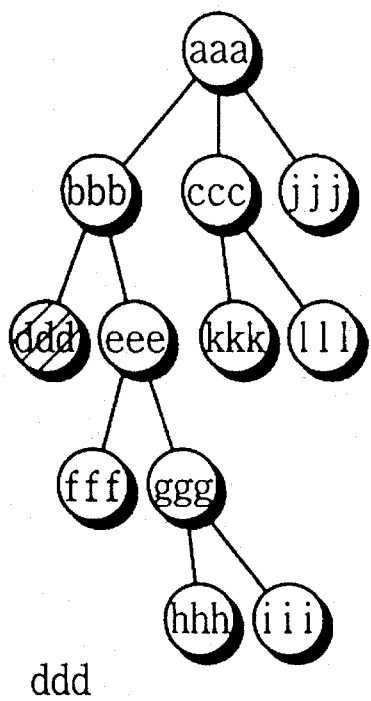
FIGS. 10A through 10F are views showing a transition from the equation tree to a string of characters.

The equation tree converting unit 19 takes out an equation tree for one sentence (S21), and makes the top node "aaa" as a current node and checks whether it has any child node (S22, S23). Since the current node "aaa" has three children nodes "bbb", "ccc", and "jjj", the equation tree converting unit 19 makes the node "bbb" in its left as the current node (S24), and further checks whether the current node "bbb" has any child node (S23). The current node moves downward from "aaa" to "bbb" to "ddd" while the above process is repeated (S23, S24) as shown in FIG. 10A.

Figure 10B:
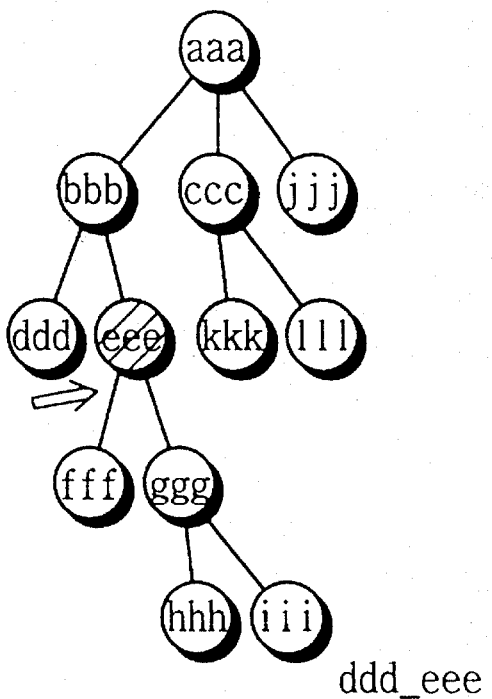

When the current node reaches the node "ddd", the equation tree converting unit 19 outputs the node "ddd" in the form of a string of characters to the job buffer 10 (S25). Subsequently, the equation tree converting unit 19 checks whether there is any node in its right (S26). Since there is a node "eee" in its right, the equation tree converting unit 19 outputs the sibling mark "_" between the nodes "ddd" and "eee" in the job buffer 10 and makes the node "eee" as the current node (S27) as shown in FIG. 10B.

Figure 10C:
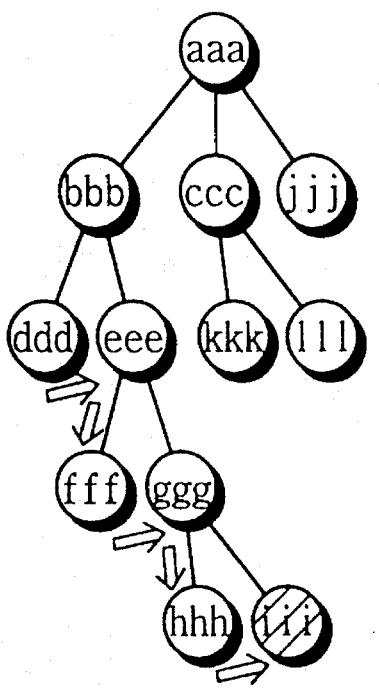

While the above process is repeated, the current node moves downward and left to right "ddd"→"eee"→"fff"→"ggg"→"hhh"→"iii" (S23 through S27) as shown in FIG. 10C.

Figure 10D:
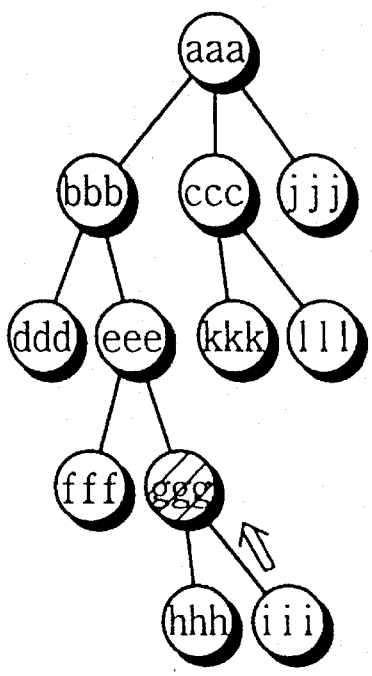
Figure 10E:
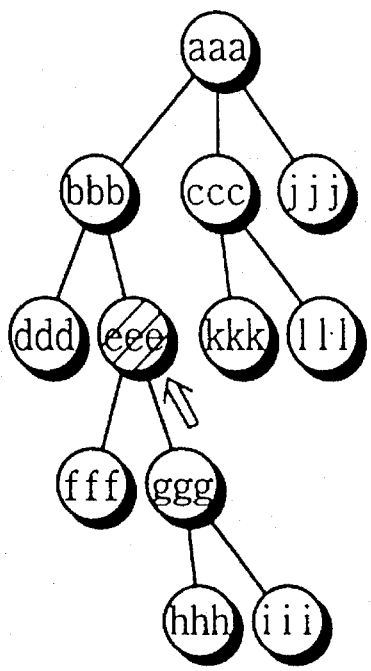
Figure 10F:
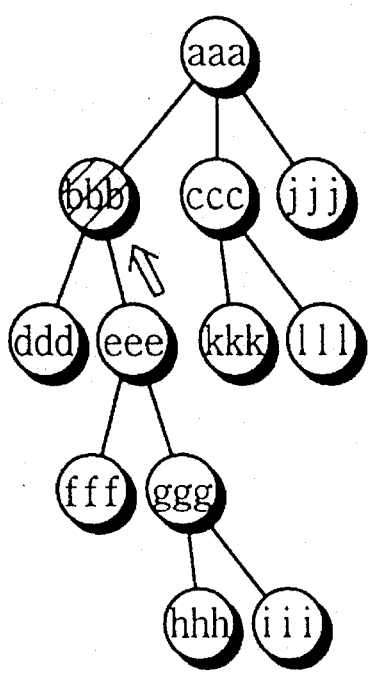

At this point, the strings of characters "ddd_eee fff_ggg hhh_iii" are stored in the job buffer 10. Since there is no node in the right of the current node "iii", the equation tree converting unit 19 parentheses the nodes in the same generation, "hhh_iii" (S28) as shown in FIG. 10D. Subsequently, the equation tree converting unit 19 moves the current node to their parent node "ggg" and parentheses "fff_ggg(hhh_iii)" (S28). Further, the equation tree converting unit 19 moves the current node to their parent node "eee" (S30), and parentheses "fff_ggg(hhh_iii)" (S28) as shown in FIG. 10E. Subsequently, the equation tree converting unit 19 moves the current node to their parent node "bbb" (S30), and parentheses "ddd_eee(fff_ggg(hhh_iii))" (S28) as shown in FIG. 10F.

With the above-described process, a single form mark is given to each particle, "て(te)", "に(ni)", "を(wo)", and "は(ha)" in the case of Japanese. Thus, their probabilities becomes substantially even, enabling further efficient compression.

Although the present invention has been fully described by way of example with reference to the accompanying drawings, it is to be noted that various changes and modification will be apparent to those skilled in the art. Therefore, unless otherwise such changes and modifications depart from the scope of the present invention, they should be construed as being included therein.

What is claimed is:

1. A text file compressing apparatus comprising:

word detecting means for detecting words in sentences comprising a text file;

representative word storage means for classifying a plurality of words into a plurality of sets of synonymous words and to store the sets with a representative word for each set;

representative word retrieval means for retrieving the representative words for the detected words from their respective sets in said representative word storage means;

representative word rewrite means for rewriting the detected words into the retrieved representative words; and coding means for coding the text file after the detected words are rewritten by said representative word rewrite means.

2. The text file compressing apparatus of claim 1, wherein said coding means includes:

correspondence table storage means for storing a correspondence table showing a relation between a plurality of words and string of bits; and string-of-bits conversion means for converting each detected word in the text file into the string of bits after the detected words are rewritten into the representative words by said representative word rewrite means.

3. The text file compressing apparatus of claim 2, wherein:

the strings of bits in said correspondence table are variable; and the representative word in each set is assigned a shortest string of bits compared with other words in the set.

4. The text file compressing apparatus of claim 3, wherein words with high probabilities with which the words appear in the texts are assigned short strings of bits, and words with small probabilities are assigned long strings of bits.

5. The text file compressing apparatus of claim 2, wherein words with high probabilities with which the words appear in the texts are assigned short strings of bits, and words with small probabilities are assigned long strings of bits.

6. The text file compressing apparatus of claim 1, wherein said coding means includes:

dictionary storage means for storing a dictionary including a plurality of words arranged in an order of their respective probabilities; and string-of-bits conversion means for converting the detected words in the text file into strings of bits after the detected words are rewritten into the representative words by said representative word conversion means, said strings of bits indicating a location of each word in the dictionary.

7. The text file compressing apparatus of claim 6 further comprising:

probability computing means for detecting the words in the sentences comprising the text file to compute probabilities with which the words appear in the text; and dictionary generation means for generating a dictionary by arranging the detected words in relation with their respective probabilities, the resulting dictionary being stored in said dictionary storage means, whereby the text file compressing apparatus yields the text file including strings of bits, and the dictionary generated by the dictionary generating means as a result of an operation.

8. The text file compressing apparatus of claim 6, wherein the dictionary stored in said dictionary storage means is shared by a plurality of text files.

9. The text file compressing apparatus of claim 1 further comprising:

take-out means for taking out sentences separately from the text file;

structure-parse means for structure-parsing each sentence to generate an equation tree, said equation tree having a tree structure with a plurality of nodes linked one with another;

string-of-characters conversion means for converting the equation tree into strings of characters, a parent-child relation being represented by a parenthesis; and sentence conversion means for converting each sentence taken out by said take-out means into the strings of characters, and wherein said correspondence table storage means stores the parenthesis in relation with strings of bits, whereby said converting means converts the parenthesis into a string of bits.

10. The text file compressing apparatus of claim 9, wherein said string-of-characters conversion means includes:

a string-of-characters buffer in which the equation tree in the form of strings of characters are arranged;

first placement means for placing a word corresponding to a parent node at a top of the equation tree, and the words corresponding to all children nodes within said string-of-character buffer, all the children nodes being parenthesized;

current node set means for making each child node into a current node in turn;

second placement means for placing a word corresponding to the current node and the words corresponding to all children nodes, all the children nodes being parenthesized; and repetition means for repeatedly activating said second placement means for each child node.

11. A text file compressing apparatus for compressing a text file, said text file compressing apparatus comprising:

detecting means for detecting words in sentences comprising a text file;

form storage means for storing form information for a plurality of words, said form information comprising infinitives and form marks indicating forms of the words;

form information retrieval means for retrieving the form information that matches with the words detected by said detection means from said form storage means;

form information rewrite means for rewriting the words detected by said detection means into their respective form information; and coding means for coding the text file after the words detected by said detecting means are rewritten into the representative words by said form information rewrite means.

12. The text file compressing apparatus of claim 11, wherein said coding means includes:

correspondence table storage means for storing a correspondence table showing a relation between a plurality of words and string of bits; and string-of-bits conversion means for converting each detected word in the text file into the string of bits after the detected words are rewritten into the representative words by said representative word rewrite means.

13. The text file compressing apparatus of claim 12, wherein the infinitives are assigned shorter strings of bits compared with their different forms in said correspondence table.

14. The text file compressing apparatus of claim 13, wherein words with high probabilities with which the words appear in the texts are assigned short strings of bits, and words with small probabilities are assigned long strings of bits.

15. The text file compressing apparatus of claim 14, wherein said correspondence storage means further stores the form marks in relation with the strings of bits, whereby said string-of-bits conversion means converts the form marks into the strings of bits.

16. The text file compressing apparatus of claim 12, wherein said coding means includes:

dictionary storage means for storing a dictionary including a plurality of words arranged in an order of their respective probabilities; and string-of-bits conversion means for converting the detected words in the text file into strings of bits after the detected words are rewritten into the representative words by said representative word conversion means, said strings of bits indicating a location of each word in the dictionary.

17. A text file compressing apparatus comprising:

first detecting means for detecting words in sentences comprising a text file;

form storage means for storing form information for a plurality of words, said form information comprising infinitives and form marks indicating forms of the words;

form information retrieval means for retrieving the form information that matches with the words detected by said first detection means from said form storage means;

form information rewrite means for rewriting the words detected by said first detection means into their respective form information;

second detecting means for detecting words in the sentences comprising the text file;

representative word storage means for classifying a plurality of words into a plurality of sets of synonymous words to store the sets with a representative word for each set;

representative word retrieval means for retrieving the representative words for the words detected by said second detection means from their respective sets in said representative word storage means;

representative word rewrite means for rewriting the words detected by said second detection means into the retrieved representative words; and coding means for coding the text file after the words detected by said second detection means are rewritten by said representative word rewrite means.

18. The text file compressing apparatus of claim 17, wherein said coding means includes:

correspondence table storage means for storing a correspondence table showing a relation between a plurality of words and string of bits; and string-of-bits conversion means for converting each detected word in the text file into the string of bits after the detected words are rewritten into the representative words by said representative word rewrite means.

19. The text file compressing apparatus of claim 18, wherein:

the strings of bits in said correspondence table are variable; and the representative word in each set is assigned a shortest string of bits compared with other words in the set and the infinitives are assigned shorter strings of bits compared with their different forms in said correspondence table.

20. The text file compressing apparatus of claim 19, wherein the representative words and infinitives with high probabilities with which the words appear in the texts are assigned short strings of bits, and words with small probabilities are assigned long strings of bits in said correspondence table.

21. The text file compressing apparatus of claim 20, wherein said correspondence storage means further stores the form marks in relation with the strings of bits, whereby said string-of-bits conversion means converts the form marks into the strings of bits.

22. A method for compressing a text file for a text file compressing apparatus including a text file storage unit for storing text files, a representative word storage unit for classifying a plurality of words into a plurality of sets of synonymous words to store the sets with a representative word for each set, and a code information storage unit for storing code information used to code words in the text file, said method comprising the steps of:

detecting words in sentences comprising the text file;

retrieving the representative words from the sets for the detected words;

rewriting the detected words with the retrieved representative words; and coding the text file after the detected words are rewritten into the representative words while referring to the code information in said code information storage unit.

23. The method of claim 22, wherein said coding step includes:

converting the words in the text file into string of bits after the detected words are rewritten into the representative words while referring to the code information in said code information storage unit, the code information being stored in the form of a correspondence table showing a relation between a plurality of words and strings of bits.

24. The method of claim 22, wherein said coding step includes:

converting the words in the text file into string of bits after the words are rewritten into the representative words while referring to the code information, the code information being stored in said code information storage unit in the form of a dictionary including words arranged in an order of probabilities with which the words appear in the file text, said strings of bits showing an order of each word in the code information.

25. The method of claim 24 further comprising the steps of:

detecting the words in the sentences comprising of the text file and computing probabilities with which the words appear in the text; and generating a dictionary by arranging the detected words in relation with their respective probabilities, the resulting dictionary being stored in said code information storage unit.

26. The method of claim 22 further comprising the steps of:

taking out sentences separately from the text file;

structure-parsing each sentence and generating an equation tree, said equation tree having a tree structure with a plurality of nodes linked on with another;

converting the equation tree into strings of characters, a parent-child relation being represented by a parenthesis; and converting each sentence taken out by said sentence taking out step into the strings of characters, wherein said code information storage unit stores the parenthesis in relation with strings of bits, whereby the parenthesis is converted into a string of bits in said sentence-to-string-of-characters converting step.

27. The method of claim 26, wherein said equation-tree-to-string-of-characters converting step includes:

arranging the equation tree in the form of strings of characters;

placing a word corresponding to a parent node at a top of the equation tree, and the words corresponding to all children nodes arranged in said arranging sub-step, all the children nodes being parenthesized;

making each child node into a current node in turn;

placing a word corresponding to the current node and the words corresponding to all children nodes, all the children nodes being parenthesized; and repeating said secondly mentioned placing sub-step for each child node.

28. A method for compressing a text file for a text file compressing apparatus including a text file storage unit for storing text files, a form storage unit for storing a plurality of words in the form of infinitives and form marks specifying a form of each word, and a code information storage unit for storing code information used to code words in the text file, said method comprising the steps of:

detecting words in sentences comprising the text file;

retrieving form information that matches with the detected words from said form storage unit;

rewriting the detected words with their respective form information; and coding the text file after the words are rewritten into the form information while referring to the code information in said code information storage unit.

29. The method of claim 28, wherein said coding step includes:

converting the words in the text file into string of bits after the detected words are rewritten into the representative words while referring to the code information in said code information storage unit, the code information being stored in the form of a correspondence table showing a relation between a plurality of words and strings of bits.

30. The method of claim 29, wherein said rewriting step includes:

rewriting the form marks in the text file into strings of bits while referring to said correspondence table, said correspondence table further showing a relation between the strings of bits and form marks.

31. A method for compressing a text file for a text file compressing apparatus including a text file storage unit for storing text files, a representative word storage unit for classifying a plurality of words into a plurality sets of synonymous words to store the sets with a representative word for each set, a form storage unit for storing a plurality of words in the form of infinitives and form marks specifying a form of each word, and a code information storage unit for storing code information used to code words in the text file, said method comprising the steps of:

detecting words in sentences comprising the text file;

retrieving form information that matches with the detected words from said form storage unit;

rewriting the detected words with the form information;

detecting words in post-rewrite sentence in the rewriting step;

retrieving the representative words for the words detected in said post-rewrite-word detecting step from the sets from said representative word storage unit;

rewriting the post-rewrite words into their respective representative words; and coding the text file after the post-rewrite words are rewritten into their respective representative words.

32. The method of claim 31, wherein said coding step includes:

converting the words in the text file into string of bits after the detected words are rewritten into the representative words while referring to the code information in said code information storage unit, the code information being stored in the form of a correspondence table showing a relation between a plurality of words and strings of bits.

33. A text file compressing apparatus comprising:

word detecting means for detecting words in sentences comprising a text file;

representative word storage means for classifying a plurality of words into a plurality of sets of synonymous words and to store the sets with a representative word for each set;

representative word retrieval means for retrieving the representative words for the detected words from their respective sets in said representative word storage means;

representative word rewrite means for rewriting the detected words into the retrieved representative words;

coding means for coding the text file after the detected words are rewritten by said representative word rewrite means;

take-out means for taking out sentences separately from the text file;

structure-parse means for structure-parsing each sentence to generate an equation tree, said equation tree having a tree structure with a plurality of nodes linked one with another;

string-of-characters conversion means for converting the equation tree into strings of characters, a parent-child relation being represented by a parenthesis; and sentence conversion means for converting each sentence taken out by said take-out means into the strings of characters, and wherein said correspondence table storage means stores the parenthesis in relation with strings of bits, whereby said converting means converts the parenthesis into a string of bits.

34. The text file compressing apparatus of claim 33, wherein said string-of-characters conversion means includes:

a string-of-characters buffer in which the equation tree in the form of strings of characters are arranged;

first placement means for placing a word corresponding to a parent node at a top of the equation tree, and the words corresponding to all children nodes within said string-of-character buffer, all the children nodes being parenthesized;

current node set means for making each child node a current node in turn;

second placement means for placing a word corresponding to the current node and the words corresponding to all children nodes, all the children nodes being parenthesized; and repetition means for repeatedly activating said second placement means for each child node.

35. A method for compressing a text file for a text file compressing apparatus, the apparatus including a text file storage unit for storing text files, a representative word storage unit for classifying a plurality of words into a plurality of sets of synonymous words to store the sets with a representative word for each set, and a code information storage unit for storing code information used to code words in the text file, said method comprising the steps of:

detecting words in sentences comprising the text file;

retrieving the representative words from the sets for the detected words;

rewriting the detected words with the retrieved representative words;

coding the text file after the detected words are rewritten into the representative words while referring to the code information in said code information storage unit;

taking out sentences separately from the text file;

structure-parsing each sentence and generating an equation tree, said equation tree having a tree structure with a plurality of nodes linked one with another;

converting the equation tree into strings of characters, a parent-child relation being represented by a parenthesis; and converting each sentence taken out by said sentence taking out step into the strings of characters, wherein said code information storage unit stores the parenthesis in relation with strings of bits, whereby the parenthesis is converted into a string of bits in said sentence-to-string-of-characters converting step.

36. The method of claim 35, wherein said equation-tree-to-string-of-characters converting step further comprises the steps of:

arranging the equation tree in the form of strings of characters;

placing a word corresponding to a parent node at a top of the equation tree, and the words corresponding to all children nodes arranged in said arranging sub-step, all the children nodes being parenthesized;

making each child node into a current node in turn;

placing a word corresponding to the current node and words corresponding to all children nodes, all the children nodes being parenthesized; and repeating said secondly mentioned placing sub-step for each child node.

37. A text file compressing apparatus comprising:

word detecting means for detecting words in sentences comprising a text file;

representative word storage means for classifying a plurality of words into a plurality of sets of synonymous words and to store the sets with a representative word for each set;

representative word retrieval means for retrieving the representative words for the detected words from their respective sets in said representative word storage means;

representative word rewrite means for rewriting the detected words into the retrieved representative words;

coding means for coding the text file after the detected words are rewritten by said representative word rewrite means;

take-out means for taking out sentences separately from the text file;

structure-parse means for structure-parsing each sentence to generate an equation tree, said equation tree having a tree structure with a plurality of nodes linked one with another;

string-of-characters conversion means for converting the equation tree into strings of characters, a parent-child relation being represented by a predetermined character; and sentence conversion means for converting each sentence taken out by said take-out means into the strings of characters, and wherein said correspondence table storage means stores the predetermined character in relation with strings of bits, whereby said converting means converts the predetermined character into a string of bits.

38. The text file compressing apparatus of claim 37, wherein said string-of-characters conversion means includes:

a string-of-characters buffer in which the equation tree in the form of strings of characters are arranged;

first placement means for placing a word corresponding to a parent node at a top of the equation tree, and the words corresponding to all children nodes within said string-of-character buffer, all the children nodes being marked by the predetermined character;

current node set means for making each child node a current node in turn;

second placement means for placing a word corresponding to the current node and the words corresponding to all children nodes, all the children nodes being marked by the predetermined character; and repetition means for repeatedly activating said second placement means for each child node.

39. A method for compressing a text file for a text file compressing apparatus, the apparatus including a text file storage unit for storing text files, a representative word storage unit for classifying a plurality of words into a plurality of sets of synonymous words to store the sets with a representative word for each set, and a code information storage unit for storing code information used to code words in the text file, said method comprising the steps of:

detecting words in sentences comprising the text file;

retrieving the representative words from the sets for the detected words;

rewriting the detected words with the retrieved representative words;

coding the text file after the detected words are rewritten into the representative words while referring to the code information in said code information storage unit;

taking out sentences separately from the text file;

structure-parsing each sentence and generating an equation tree, said equation tree having a tree structure with a plurality of nodes linked one with another;

converting the equation tree into strings of characters, a parent-child relation being represented by a predetermined character; and converting each sentence taken out by said sentence taking out step into the strings of characters, wherein said code information storage unit stores the predetermined character in relation with strings of bits, whereby the predetermined character is converted into a string of bits in said sentence-to-string-of-characters converting step.

40. The method of claim 39, wherein said equation-tree-to-string-of-characters converting step further comprises the steps of:

arranging the equation tree in the form of strings of characters;

placing a word corresponding to a parent node at a top of the equation tree, and the words corresponding to all children nodes arranged in said arranging sub-step, all the children nodes being marked by the predetermined character;

making each child node into a current node in turn;

placing a word corresponding to the current node and words corresponding to all children nodes, all the children nodes being marked by the predetermined character and repeating said secondly mentioned placing sub-step for each child node.

* * * * *